(12) United States Patent
Phu et al.

(10) Patent No.: US 6,764,626 B2
(45) Date of Patent: Jul. 20, 2004

(54) METHOD OF GALVANIZING PART OF A PIECE OBTAINED BY INJECTION MOLDING

(75) Inventors: Marc Phu, Lame (FR); Emmanuel Roche, Garches (FR); Bertrand Cupif, Antony (FR)

(73) Assignee: Alcatel, Paris (FR)

(*) Notice: Subject to any disclaimer, the term of this patent is extended or adjusted under 35 U.S.C. 154(b) by 0 days.

(21) Appl. No.: 10/192,496

(22) Filed: Jul. 11, 2002

(65) Prior Publication Data

US 2003/0012968 A1 Jan. 16, 2003

(30) Foreign Application Priority Data

Jul. 16, 2001 (FR) .............................. 01 09463

(51) Int. Cl.[7] .............................. B05D 1/36; B05D 5/00
(52) U.S. Cl. ................... 264/129; 264/132; 264/134; 427/407.1; 427/258; 427/433
(58) Field of Search ............................ 427/407.1, 258, 427/433; 264/129, 134, 132

(56) References Cited

U.S. PATENT DOCUMENTS 4,101,698 A   7/1978 Dunning et al.
6,147,660 A * 11/2000 Elliott .................... 343/895
6,333,716 B1 * 12/2001 Pontoppidan .............. 343/702
6,396,444 B1 *  5/2002 Goward et al. ............. 343/702

FOREIGN PATENT DOCUMENTS

GB   2345022     6/2000
WO   9634730    11/1996

OTHER PUBLICATIONS

Patent Abstracts of Japan, vol. 017, No. 537 (M–1487), Sep.28, 1993 corresponding to JP 05 147396 (Nissha Printing Co Ltd) dated Jun. 15, 1993.

* cited by examiner

Primary Examiner—Michael Barr
(74) Attorney, Agent, or Firm—Sughrue Mion, PLLC

(57) ABSTRACT

The present invention is a method of partially galvanizing a piece obtained by injection molding, and a partially galvanize product produced by the method. The method of the present invention includes inserting a film of non-galvanizable material into a mold and then injecting a galvanizable material into the mold. After injection, the piece is taken out of the mold and the entire piece is run through a galvanizing process. Because of the film, a portion of the piece is galvanized, while the portion having the film is not galvanized.

11 Claims, 2 Drawing Sheets

FIG_1
PRIOR ART
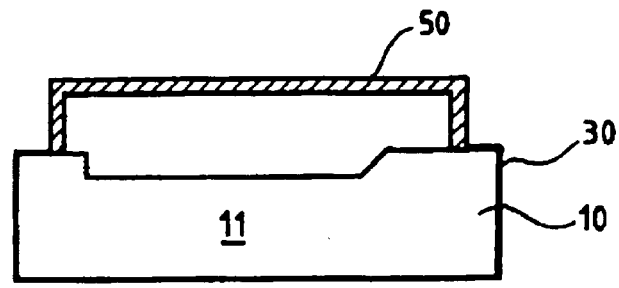
FIG_2
PRIOR ART
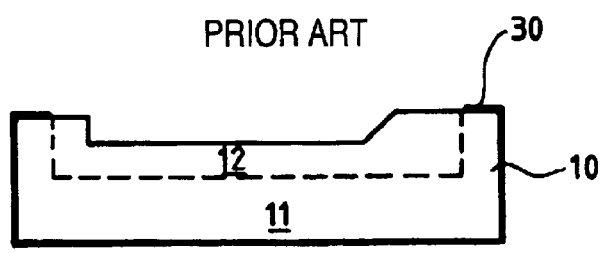
FIG_3
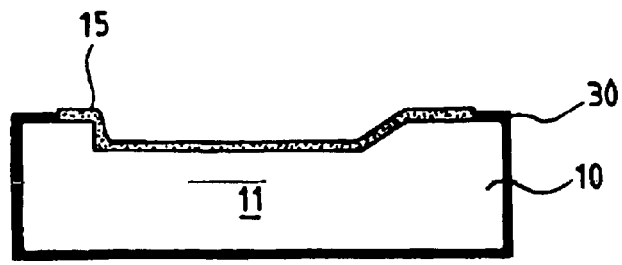

FIG_4a
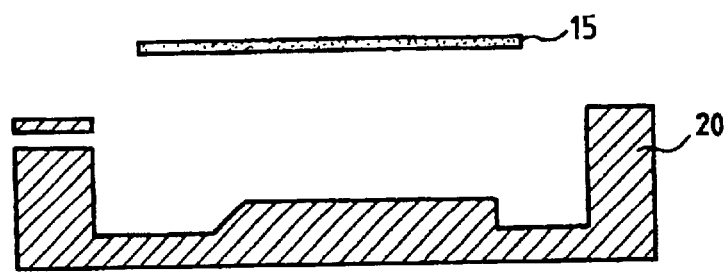
FIG_4b
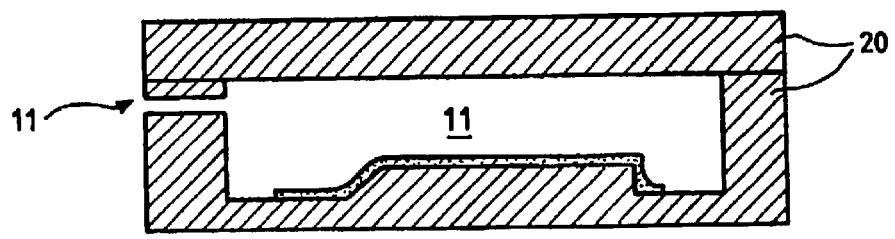

METHOD OF GALVANIZING PART OF A PIECE OBTAINED BY INJECTION MOLDING

The present invention relates to a method of galvanizing a piece of arbitrary shape and size, and in particular to a method of galvanizing part of such a piece.

BACKGROUND OF THE INVENTION

Galvanization is a technique presently used in numerous industries and it enables pieces to be obtained having a chromium-titanium- or gold-plated appearance, for example. Galvanization is essentially an electrolytic reaction whereby a metallic salt is deposited on a metal, generally in order to preserve it from oxidation. Galvanizing a piece thus makes it possible to obtain an appearance that is metallic and non-oxidizable.

Galvanized pieces are not necessarily themselves made of metal, but they can be made of some other material, e.g. a plastics material, for reasons of expense and ease of obtaining particular shapes. Plastics materials are of low cost and easy to work, so pieces can be obtained having all kinds of shapes, in particular by using the known techniques of injecting the plastics material into a mold. Various families of plastics materials can be used for injection molding, such as polycarbonate (PC), polyethylene terephthalate (PET), or acrylonitrile butadiene styrene (ABS), for example. In addition, certain families of plastics can be galvanized, such as ABS for example, while others cannot, such as PC, for example.

Thus, galvanizing pieces made of plastics material represents numerous applications in a variety of industries, such as the automobile industry, the industry providing radio communications terminals or personal assistants, or any other industry where it is necessary to give a non-oxidizable metal-plated appearance to a piece that is made of plastics material.

Galvanizing a plastics material piece essentially requires the following steps to be performed: dipping the piece in a chemical acid bath which etches the surface of the plastics material and creates cavities in the surface of the piece; and then dipping the piece in succession in a plurality of metallic baths serving firstly to deposit metals (e.g. copper and/or nickel) into the surface cavities of the plastics material, and secondly to perform galvanization proper by depositing metallic salts which react electrolytically with the previously deposited metal. The baths of metallic salts can be based on chromium, titanium, or gold, for example, depending on the final appearance required for the galvanized piece.

Depending on requirements, techniques, or taste, it can be advantageous for a given piece to present an appearance that is not metallic in part, e.g. that has the appearance of a plastics material, and that is metallic in part, i.e. it can be preferable for a single piece to be galvanized in part only.

Various techniques for partially galvanizing pieces have already been proposed in the prior art. A first technique, shown in FIG. 1, consists in making a piece 10 out of a galvanizable material 11, and in using a mask 50 that leaves apparent only those zones which are to be galvanized, after which the piece 10 is dipped in the galvanizing baths 30. A second technique, illustrated in FIG. 2 and described for example in patent application EP 0 256 482 A2, consists in making a piece 10 out of at least two distinct materials 11 and 12, one of which is galvanizable (material 11) while the other is not (material 12), with the piece advantageously being made by a dual injection method in a suitable mold. The entire piece is then dipped into the galvanizing baths, but only one type of material 11 is etched by the acid and thus galvanized by the metallic baths 30.

Those techniques known in the prior art present numerous drawbacks. The use of a mask adds a step to the method of manufacturing the pieces, and that can be penalizing in large-volume production. In addition, it is necessary to provide fixing points for the mask on the piece that is to be galvanized, and this can be detrimental to the overall appearance of the piece and can present difficulties for pieces that are small in size.

The dual injection technique is made complex by the need to handle two different materials. In addition, the molds used for dual injection are much more complex than those used for injecting using a single material only.

However, partial galvanization, in particular of pieces made of plastics material, is becoming increasingly widespread, particularly in industries that use design as a selling technique. It enables pieces to be made using materials that are of low cost, said pieces presenting surface portions that are metallic in appearance (e.g. chrome-plated) that are continuous with surface portions having the appearance of plastics materials.

OBJECTS AND SUMMARY OF THE INVENTION

The invention can thus be applied to a radio communication terminal, such as a mobile telephone or a personal assistant, comprising a shell of plastic material that is galvanized in part only. The invention can also be applied to a plastics material motor vehicle piece that is galvanized in part only.

The ability to galvanize a single piece of plastics material in part only is thus of great interest. The invention provides such a method, while avoiding the drawbacks of the prior art.

More particularly, the present invention provides a method of partially galvanizing a piece obtained by injection molding, the method comprising the following steps:
  inserting a film in a mold;
  injecting a galvanizable material into the mold;
  unmolding the piece; and
  galvanizing the entire piece;
said film being made of a material that is not galvanizable and that adheres strongly to the injected galvanizable material.

According to an advantageous characteristic, the method of the invention includes a step of coloring and/or printing the film prior to inserting it in the mold.

In various embodiments, the film is printed by silkscreen printing or by ink jet printing.

In various embodiments, the film is printed on the outside face of the film, or else on the inside face of the film, i.e. its face which comes into contact with the injected material, said film then being constituted by a material that is transparent.

In various embodiments, the film is of polycarbonate (PC), of polybutylene terephthalate (PBT), or of polymethyl methacrylate (PMMA).

According to a characteristic, the galvanizable material injected into the mold to constitute the piece is a plastics material, advantageously acrylonitrile butadiene styrene (ABS), or acrylonitrile butadiene styrene/polycarbonate (ABS/PC).

The invention also provides a piece made of a galvanizable material having a portion of its visible surface galvanized, wherein the non-galvanized portion of its visible surface is covered in a film of non-galvanizable material that adheres strongly to the galvanizable material constituting the piece.

According to a characteristic, the film covering the non-galvanized visible portion of the surface carries decoration.

In various embodiments, the decoration is coloring and/or printing.

According to a characteristic, the partially galvanized piece is made of a plastics material, advantageously of acrylonitrile butadiene styrene (ABS), or of acrylonitrile butadiene styrene/polycarbonate (ABS/PC).

In a particular application, the invention provides a radio communications terminal comprising a shell whose outside surface is galvanized in part, wherein the non-galvanized portion of the surface of the shell is covered in a film of non-galvanizable material that adheres strongly to the material constituting the shell.

BRIEF DESCRIPTION OF THE DRAWINGS

The features and advantages of the invention appear more clearly on reading the following description given by way of non-limiting illustration and with reference to the accompanying figures, in which:

FIG. 1, described above, shows a piece galvanized using a first prior art technique;

FIG. 2, described above, shows a piece galvanized using a second prior art technique;

FIG. 3 shows a piece galvanized using the method of the invention; and

FIGS. 4a and 4b show steps in the injection molding method of the invention.

MORE DETAILED DESCRIPTION

With reference to FIG. 3, a piece 10 is partially galvanized 30. The piece 10 is made of a galvanizable material 11, e.g. a plastics material such as acrylonitrile butadiene styrene (ABS), or acrylonitrile butadiene styrene/polycarbonate (ABS/PC) which can be etched in acid baths to enable metal particles to be deposited followed by a galvanization reaction in which metallic salts are deposited, as described above with reference to the prior art. The piece 10 is advantageously made using a conventional injection molding technique so that it can be made to have almost any shape.

The piece 10 needs to be galvanized 30 over only a particular fraction of its visible surface. For this purpose, in the invention, a film 15 is inserted in the mold 20 that is used for injection molding the piece. As shown in FIGS. 4a and 4b, the film 15 is inserted prior to the material 11 (plastics or other material) being injected, the film being pressed firmly against one of the walls of the mold 20 so as to avoid any risk of it peeling off or wrinkling while the material 11 is being injected under pressure into the mold. The film 15 can be put into place manually or by a robot, depending on the industry concerned.

The film 15 must be made of a material that is not galvanizable, such as a plastics material constituted by polycarbonate (PC), polybutylene terephthalate (PBT), or polymethyl methacrylate (PMMA), for example, and it must be compatible with the material 11 that is injected to make the piece 10. In particular, the material constituting the film 15 must present good adhesion on the injected material 11. In addition, it is preferable for the film 15 to be relatively fine so as to avoid modifying the shape of the piece as determined by the mold.

According to a particular feature of the present invention, the film 15 is advantageously decorated prior to being inserted in the mold 20. The decoration can consist in coloring so as to impart a particular color to the non-galvanized portion of the visible surface of the piece 10. The decoration can also consist in printing, e.g. a logo, text, etc., implemented using conventional silkscreen or ink jet printing techniques. Depending on the implementation and the final application, the decoration can be put on the inside surface of the film that comes into contact with the injected material, in which case the film should be transparent, or alternatively the decoration can be put on the outside surface of the film. The decoration is preferably put on the inside surface of the film so as to protect it from abrasion and so as to make it longer lasting over time.

After the injection molding and unmolding of the piece, implemented using conventional techniques, the piece 10 incorporating the film 15 is galvanized in full, i.e. without using any masks or other kinds of protection.

Acid baths etch the material 11 constituting the piece 10 but do not etch the film 15. Cavities for metal deposits therefore form only in that portion of the surface of the piece 10 that is not protected by the film 15, so the galvanization reaction is prevented from taking place on the portion of the surface of the piece that is covered by the film 15. A piece 10 is thus obtained which is galvanized in part only, comprising a visible surface portion that is not metallic in appearance and a visible surface portion that is metallic, the surfaces in these two portions being continuous one with another and the non-metallized visible surface portion being advantageously covered in a film that is decorated.

The method of the invention thus associates the function of partially galvanizing a piece with the ability to decorate the piece. In addition, the method is easy to implement and inexpensive in the context of industrial mass production.

What is claimed is:

1. A method of partially galvanizing a piece obtained by injection molding, the method comprising the following steps:

inserting a previously manufactured film into a mold;

injecting a galvanizable material into the mold;

unmolding the piece; and galvanizing the entire piece;

said film being made of a material that is not galvanizable and that adheres to the injected galvanizable material, and wherein said film is not manufactured or molded in any portion of said mold prior to being inserted into said mold.

2. A method of partially galvanizing a piece obtained by injection molding, the method comprising the following steps:

at least one of coloring an printing a film;

inserting said film into a mold after said at least one of coloring and printing step;

injecting a galvanizable material into the mold;

unmolding the piece; and galvanizing the entire piece;

said film being made of a material that is not galvanizable and that adheres to the injected galvanizable material.

3. A galvanization method according to claim 2, wherein the film is printed by at least one of silkscreen printing and ink jet printing.

4. A galvanization method according to claim 2, wherein the film is printed on the inside face of the film that comes into contact with the injected material.

5. A galvanization method according to claim 2, wherein the film is said at least one of colored and printed on an outside face of the film.

6. A galvanization method according to claim 1, wherein the film is made of at least one of polycarbonate, polybutylene terephthalate, and polymethyl methacrylate.

7. A galvanization method according to claim 1, wherein the galvanizable material injected into the mold to constitute the piece is a plastics material.

8. A galvanization method according to claim 7, wherein the plastics material injected into the mold to make the piece is made of at least one of acrylonitrile butadiene styrene, and acrylonitrile butadiene styrene/polycarbonate.

9. A galvanization method according to claim 4, wherein said film is constituted by a transparent material.

10. A method of partially galvanizing a piece obtained by injection molding, the method comprising the following steps:

inserting a previously manufactured component into a mold;

injecting a galvanizable material into the mold;

unmolding the piece; and galvanizing the entire piece;

said previously manufactured component being made of a material that is not galvanizable and that adheres to the injected galvanizable material, and wherein said film is not manufactured or molded in any portion of said mold prior to being inserted into said mold.

11. A galvanization method according to claim 10, wherein said previously manufactured comment is a film.

* * * * *